United States Patent
Hsu et al.

(10) Patent No.: US 12,068,364 B2
(45) Date of Patent: Aug. 20, 2024

(54) METAL INSULATOR METAL CAPACITOR STRUCTURE HAVING HIGH CAPACITANCE

(71) Applicant: Taiwan Semiconductor Manufacturing Co., Ltd., Hsinchu (TW)

(72) Inventors: Chen-Yin Hsu, Tainan (TW); Chun Li Wu, Tainan (TW); Ching-Hung Kao, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/875,026

(22) Filed: Jul. 27, 2022

(65) Prior Publication Data

US 2022/0367610 A1 Nov. 17, 2022

Related U.S. Application Data (60) Continuation of application No. 16/877,341, filed on May 18, 2020, now Pat. No. 11,502,161, which is a division of application No. 15/906,724, filed on Feb. 27, 2018, now Pat. No. 10,658,455.

(60) Provisional application No. 62/564,437, filed on Sep. 28, 2017.

(51) Int. Cl.
  *H01L 49/02* (2006.01)
(52) U.S. Cl.
  CPC .............. *H01L 28/91* (2013.01); *H01L 28/75* (2013.01)

(58) Field of Classification Search
  None
  See application file for complete search history.

(56) References Cited

U.S. PATENT DOCUMENTS

| | | | |
|---|---|---|---|
| 6,461,914 B1 | 10/2002 | Roberts et al. | |
| 6,465,297 B1 | 10/2002 | Henry et al. | |
| 10,720,385 B2 | 7/2020 | Chen et al. | |
| 2003/0197215 A1* | 10/2003 | Coolbaugh | H01L 21/76838 |
| | | | 257/E21.252 |

(Continued)

FOREIGN PATENT DOCUMENTS

| | | |
|---|---|---|
| CN | 1639861 A | 7/2005 |
| CN | 1729572 A | 2/2006 |

(Continued)

OTHER PUBLICATIONS

Office Action, dated Jul. 29, 2019, for Taiwan Intellectual Property Office Patent Appl. No. 107129119, 8 pages.

(Continued)

*Primary Examiner* — Long Pham
(74) *Attorney, Agent, or Firm* — Sterne, Kessler, Goldstein & Fox P.L.L.C.

(57) ABSTRACT

The present disclosure relates to a semiconductor device and a manufacturing method, and more particularly to a MIM dual capacitor structure with an increased capacitance per unit area in a semiconductor structure. Without using additional mask layers, a second parallel plate capacitor can be formed over a first parallel plate capacitor, and both capacitors share a common capacitor plate. The two parallel plate capacitors can be connected in parallel to increase the capacitance per unit area.

20 Claims, 7 Drawing Sheets

(56) References Cited

U.S. PATENT DOCUMENTS

| | | |
|---|---|---|
| 2005/0116276 A1 | 6/2005 | Gau |
| 2005/0142851 A1 | 6/2005 | Kim |
| 2005/0272216 A1* | 12/2005 | Remmel ............ H01L 23/5223 |
| | | 257/E27.025 |
| 2005/0287755 A1 | 12/2005 | Bachmann et al. |
| 2007/0037394 A1 | 2/2007 | Su et al. |
| 2012/0241908 A1 | 9/2012 | Tsao et al. |
| 2020/0350245 A1 | 11/2020 | Chen et al. |

FOREIGN PATENT DOCUMENTS

| | | |
|---|---|---|
| DE | 10260352 A1 | 7/2004 |
| JP | 2005526378 A | 9/2005 |
| JP | 4216588 B2 | 1/2009 |
| KR | 20140113870 A | 9/2014 |

OTHER PUBLICATIONS

Office Action, dated Nov. 13, 2019, for Korean Intellectual Property Office Patent Appl. No. 10-2018-0066366, 6 pages.
Office Action, dated Sep. 4, 2020, for Korean Intellectual Property Office Patent Appl. No. 10-2018-0066366, 6 pages.

* cited by examiner

METAL INSULATOR METAL CAPACITOR STRUCTURE HAVING HIGH CAPACITANCE

CROSS-REFERENCE TO RELATED APPLICATION

This application is a continuation of U.S. Non-provisional application Ser. No. 16/877,341, titled "Metal Insulator Metal Capacitor Structure Having High Capacitance," filed on May 18, 2020, which is a divisional of U.S. Non-provisional application Ser. No. 15/906,724, titled "Metal Insulator Metal Capacitor Structure Having High Capacitance," filed on Feb. 27, 2018, which claims the benefit of U.S. Provisional Patent Application No. 62/564,437, titled "Metal Insulator Metal Capacitor Structure Having High Capacitance," which was filed on Sep. 28, 2017, all of which are incorporated herein by reference in their entireties.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component or line that can be created using a fabrication process) has decreased.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values can be due to slight variations in manufacturing processes or tolerances.

The term "substantially" as used herein indicates the value of a given quantity varies by ±5% of the value.

The term "about" as used herein indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

Capacitors are elements that are used in semiconductor devices for storing an electrical charge. Capacitors are used in, for example, filters, analog-to-digital converters, memory devices, control applications, and many other types of semiconductor devices. One type of capacitor is a metal-insulator-metal (MIM) capacitor. The MIM capacitor can be formed with two conductive plates in parallel with a dielectric layer sandwiched therebetween.

As technologies progress, integrated circuits are characterized by decreasing dimension requirements over previous generation devices. Dimensions of capacitors are also decreased, which can lead to reduced capacitances. However, in some applications, a higher capacitance is needed to maintain and improve device electrical performance.

Capacitance can be affected by a number of factors such as, for example, the dielectric constant of the dielectric material, the dimensions of the capacitor plates, and the distance separating the capacitor plates. Specifically, capacitance is proportional to the dielectric constant and effective surface area of the capacitor plates, while it is inversely proportional to the separation between the capacitor plates. For example, a greater dielectric constant or capacitor plate dimension can increase capacitance, while a larger separation between the capacitor plates can reduce capacitance.

Further, adjusting these factors to increase the capacitance may entail a number of problems. For example, increasing the effective surface area of the capacitor plates on the semiconductor devices may not improve the capacitance per unit area and requires more device space allocated for the capacitor which may be prohibited by the requirements for decreasing device dimension. A dielectric layer with a high dielectric constant can be expensive and harmful to the environment. Further, a capacitor with insufficient separation between the parallel capacitor plates can lead to a lower break down voltage for the capacitor.

Various embodiments in accordance with this disclosure provides mechanisms of forming a MIM dual capacitor structure to increase capacitance per unit area in a semiconductor structure. Without using additional mask layers, a second parallel plate capacitor can be formed over a first parallel plate capacitor and both capacitors can share a common capacitor plate, according to some embodiments. The two parallel plate capacitors can be connected in parallel to increase the capacitance per unit area. In accordance with some embodiments of this disclosure, the MIM dual capacitor structure has the following benefits: (i) a higher capacitance per unit area; (ii) compatibility with current layout design and process flow without the need for additional masks; and (iii) improved capacitance range in chip designs.

Figure 1:
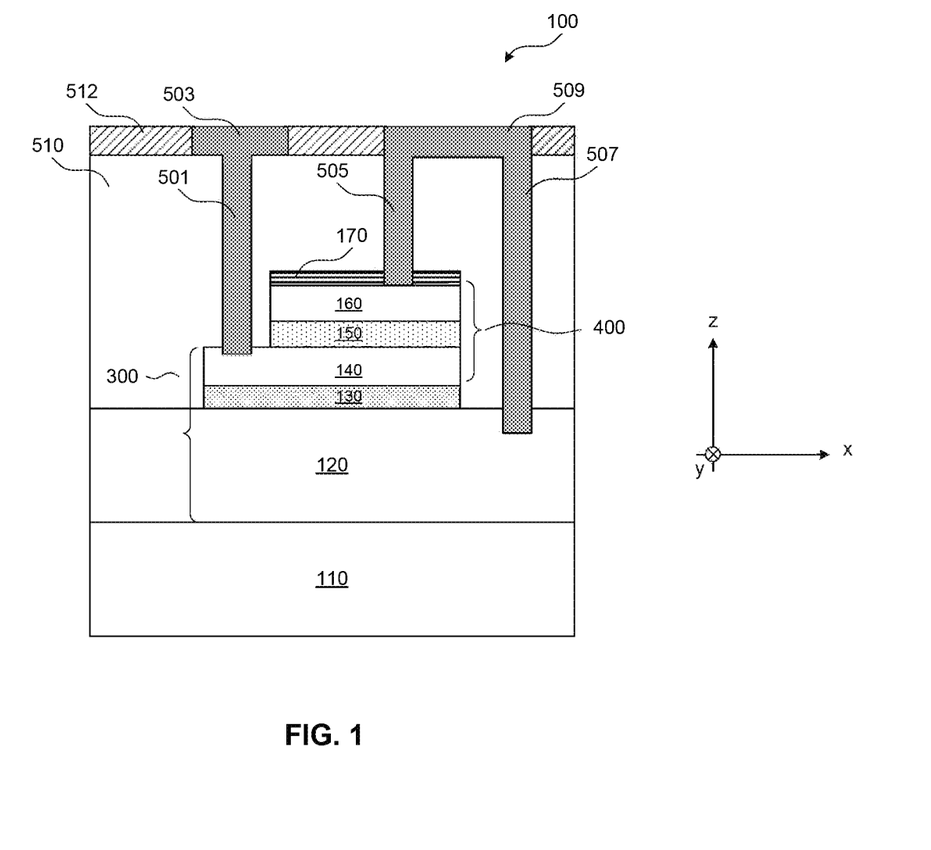
FIG. 1 is a cross-sectional view of an exemplary double MIM capacitor structure, in accordance with some embodiments.

FIG. 1 is a cross-sectional view of a MIM dual capacitor structure 100, in accordance with some embodiments of the present disclosure. MIM dual capacitor structure 100 can include a substrate 110, a first capacitor electrode 120, a first dielectric layer 130, a second capacitor electrode 140, a second dielectric layer 150, a third capacitor electrode 160, a capping layer 170, a first contact 501, a first interconnect 503, a second contact 505, a third contact 507, a second interconnect 509, an intermetallic dielectric layer 510, a dielectric layer 512.

As shown in FIG. 1, MIM dual capacitor structure 100 includes a first capacitor structure 300 and a second capacitor structure 400 that are electrically connected in parallel by a first contact 501, a first interconnect 503, a second contact 505, a third contact 507, and a second interconnect 509. The total capacitance of MIM dual capacitor structure 100 is the sum of the respective capacitance values of first and second capacitor structures 300 and 400. Therefore, a nominal total capacitance can be achieved by adjusting the capacitance values of each capacitor structure. Capacitance for each capacitor structure is determined by a number of parameters such as, for example, dielectric constant of the dielectric material, capacitor plate dimensions, and capacitor plate separation.

Substrate 110 can be a silicon substrate, according to some embodiments. In some embodiments, substrate 110 can be (i) another semiconductor, such as germanium; (ii) a compound semiconductor; (iii) an alloy semiconductor including silicon germanium (SiGe); or (iv) combinations thereof. In some embodiments, substrate 110 can be a semiconductor on insulator (SOI). In some embodiments, substrate 110 can be an epitaxial material.

First capacitor electrode 120 is disposed on the substrate 110. In some embodiments, first capacitor electrode 120 is formed from an aluminum copper alloy. In some embodiments, first capacitor electrode 120 can be formed from other conductive materials such as, for example, tantalum nitride, aluminum, copper, tungsten, metal silicides, other suitable metal or metal alloys, and/or combinations thereof. In some embodiments, first capacitor electrode 120 can include more than one layer. In some embodiments, the horizontal dimension of first capacitor electrode 120 in the x or y direction can be in a range from about 1 µm to about 500 µm (e.g., 1 µm to 500 µm). In some embodiments, the thickness of first capacitor electrode 120 can be in a range from about 1000 Å to about 2000 Å (e.g., 1000 Å to 2000 Å). As shown in FIG. 1, the y direction is illustrated as a direction pointing into the page.

First dielectric layer 130 is disposed on first capacitor electrode 120. First dielectric layer 130 can be made of a high-k dielectric material (e.g., material with a dielectric constant greater than 3.9). In some embodiments, first dielectric layer 130 can be formed of any suitable dielectric material such as, for example, silicon nitride ($SiN_x$). Other suitable dielectric material can be used such as, for example, silicon oxide ($SiO_x$), hafnium oxide ($HfO_2$), other suitable dielectric material, and/or combinations thereof. In some embodiments, first dielectric layer 130 can include one or more layers. Capacitances of parallel plate capacitors are inversely proportional to the dielectric layer thickness, thus the thickness of first dielectric layer 130 can be selected to achieve a nominal capacitance. In some embodiments, the thickness of first dielectric layer 130 can be in a range from about 100 Å to about 500 Å (e.g., 200 Å to 500 Å or 100 Å to 400 Å).

Second capacitor electrode 140 is disposed over first dielectric layer 130. In some embodiments, second capacitor electrode 140 can be formed using the same material as first capacitor electrode 120. In some embodiments, second capacitor electrode 140 can be formed using a different material. In some embodiments, the horizontal dimension of second capacitor electrode 140 in the x or y direction can be in a range from about 0.5 µm to about 200 µm (e.g., 0.5 µm to 200 µm). In some embodiments, the thickness of second capacitor electrode 140 can be in a range from about 200 Å to about 2000 Å (e.g., 200 Å to 2000 Å).

Second dielectric layer 150 is disposed over second capacitor electrode 140. In some embodiments, second dielectric layer 150 can be formed using the same material as first dielectric layer 130. In some embodiments, second dielectric layer 150 can be formed using a different material. The thickness of second dielectric layer 150 can be selected to achieve a nominal capacitance. In some embodiments, the thickness of second dielectric layer 150 can be in a range from about 100 Å to about 500 Å (e.g., 200 Å to 500 Å or 100 Å to 400 Å).

Third capacitor electrode 160 is disposed over second dielectric layer 150. In some embodiments, third capacitor electrode 160 can be formed using the same material as first capacitor electrode 120 and second capacitor electrode 140. In some embodiments, third capacitor electrode 160 can be formed using a different material. In some embodiments, the horizontal dimension of third capacitor electrode 160 can be in a range from about 0.5 µm to about 200 µm (e.g., 0.5 µm to 200 µm). In some embodiments, the thickness of third capacitor electrode 160 can be in a range from about 200 Å to about 2000 Å (e.g., 200 Å to 2000 Å).

Capping layer 170 is disposed over and covers a top surface of third capacitor electrode 160. In some embodiments, capping layer 170 can be a hardmask layer. For example, capping layer 170 can be a hardmask layer formed of silicon nitride, silicon oxide, other suitable materials, and/or combinations thereof.

Intermetallic dielectric layer 510 can be an insulating layer used to provide electrical insulation between interconnect lines in MIM dual capacitor structure 100. Intermetallic dielectric layer 510 can be formed on the exposed surfaces of first capacitor electrode 120, first dielectric layer 130, second capacitor electrode 140, second dielectric layer 150, third capacitor electrode 160, and capping layer 170. In some embodiments, intermetallic dielectric layer 510 can be formed of silicon oxide, undoped silica glass, fluorinated silica glass, other suitable materials, and/or combinations thereof. In some embodiments, intermetallic dielectric layer 510 is formed using a low-k dielectric material (e.g., material with a dielectric constant less than 3.9).

Similar to intermetallic dielectric layer 510, dielectric layer 512 can be an insulating layer used to provide electrical insulation between interconnect lines and other layers of the MIM dual capacitor structure 100. In some embodiments, trenches can be formed in dielectric layer 512 such that interconnect structures can be formed to provide electrical connection. In some embodiments, dielectric layer 512 can be formed with a similar material as intermetallic dielectric layer 510, such as silicon oxide, undoped silica glass, fluorinated silica glass, other suitable materials, and/or combinations thereof. In some embodiments, dielectric layer 512 can be formed using a different material than intermetallic dielectric layer 510. In some embodiments, dielectric layer 512 is formed using a low-k dielectric material.

First contact 501 can be used to provide electrical connection to second capacitor electrode 140. First contact 501 can be formed in intermetallic dielectric layer 510 and in contact with second capacitor electrode 140. In some embodiments, first contact 501 can extend into second capacitor electrode 140 to ensure a reliable low resistance electrical contact. In some embodiments, the extension can be greater than about 0.2 µm. In some embodiments, first contact 501 is formed using copper, tungsten, aluminum, other suitable metals, and/or combinations thereof.

First interconnect 503 can be used to provide electrical connection to first contact 501 and can also be used as a metallic interconnect for electrically connecting MIM dual capacitor structure 100 to exterior devices or peripheral circuits. For example, first interconnect 503 can be a metallic pad formed over first contact 501 and used for wire bonding. In some embodiments, first interconnect 503 can be a conductive wire embedded in dielectric layer 512. In some embodiments, first interconnect 503 is formed using copper, tungsten, aluminum, other suitable metals, and/or combinations thereof.

Second contact 505 can be used to provide electrical connection to third capacitor electrode 160. Second contact 505 can be formed in intermetallic dielectric layer 510 and in contact with third capacitor electrode 160. Second contact 505 extends through capping layer 170 and is electrically connected to third capacitor electrode 160. In some embodiments, second contact 505 extends into third capacitor electrode 160 to ensure a reliable low resistance electrical contact. In some embodiments, the extension can be greater than about 0.2 µm. In some embodiments, second contact 505 is formed using a material similar to first contact 501.

Third contact 507 can be used to provide electrical connection to first capacitor electrode 120. Third contact 507 can be formed in intermetallic dielectric layer 510 and in contact with first capacitor electrode 120. In some embodiments, third contact 507 can be in contact with a top surface of first capacitor electrode 120. In some embodiments, third contact 507 can extend into first capacitor electrode 120 to ensure a reliable low resistance electrical contact. In some embodiments, third contact 507 is formed using a material that is similar to second contact 505.

Second interconnect 509 is a metallic interconnect that can be used to establish electrical connection between second contact 505 and third contact 507. Second interconnect 509 can be used as a metallic interconnect for electrically connecting MIM dual capacitor structure 100 to exterior devices and peripheral circuits. For example, second interconnect 509 can be a metallic pad used for wire bonding. In some embodiments, second interconnect 509 can be a conductive wire embedded in dielectric layer 512. In some embodiments, second interconnect 509 can be formed using a material that is similar to first interconnect 503.

Figure 4A:
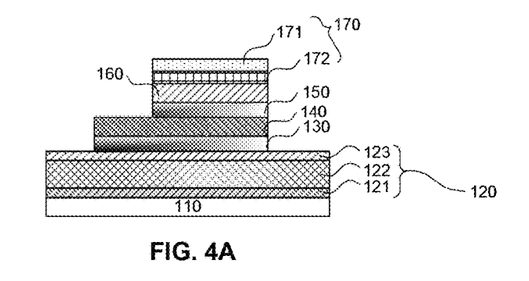
FIGS. 4A-4F are respective cross-sectional and top-down views of a partially-fabricated exemplary double MIM capacitor structure after a second removal process, in accordance with some embodiments.
Figure 4B:
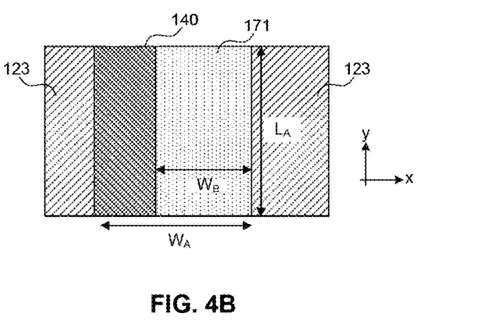
Figure 4C:
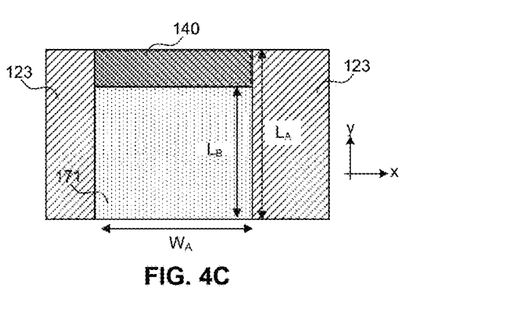
Figure 4D:
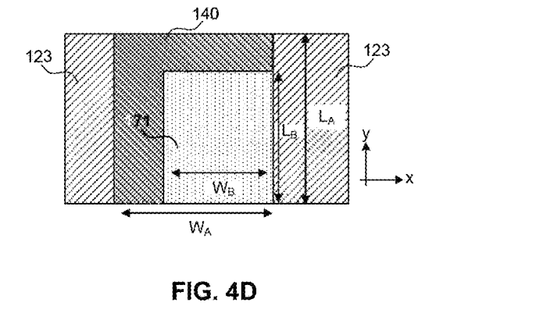
Figure 4E:
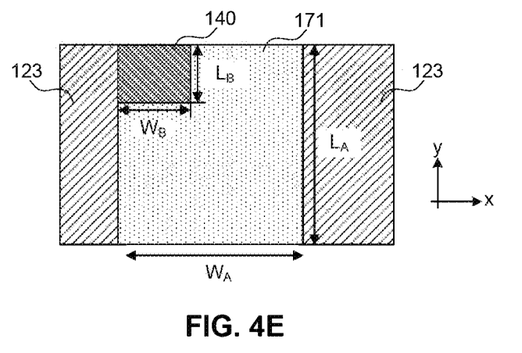
Figure 4F:
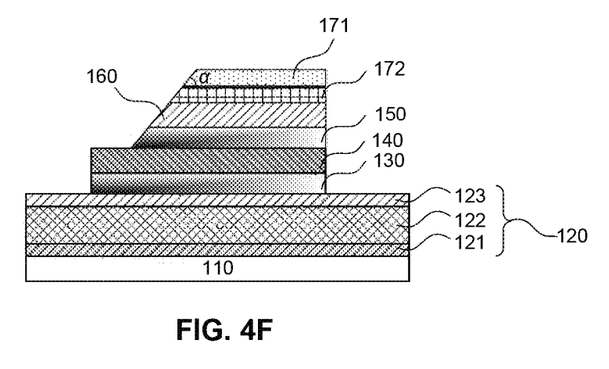
Figure 5:
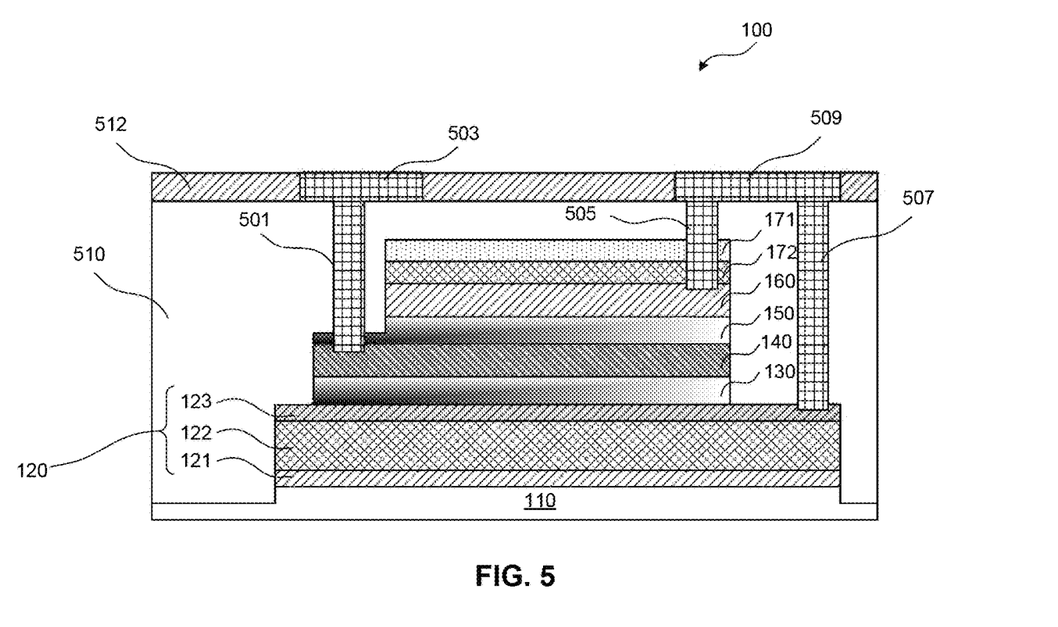
FIG. 5 is a cross-sectional view of a partially-fabricated exemplary double MIM capacitor structure after forming contacts, in accordance with some embodiments.
Figure 6:
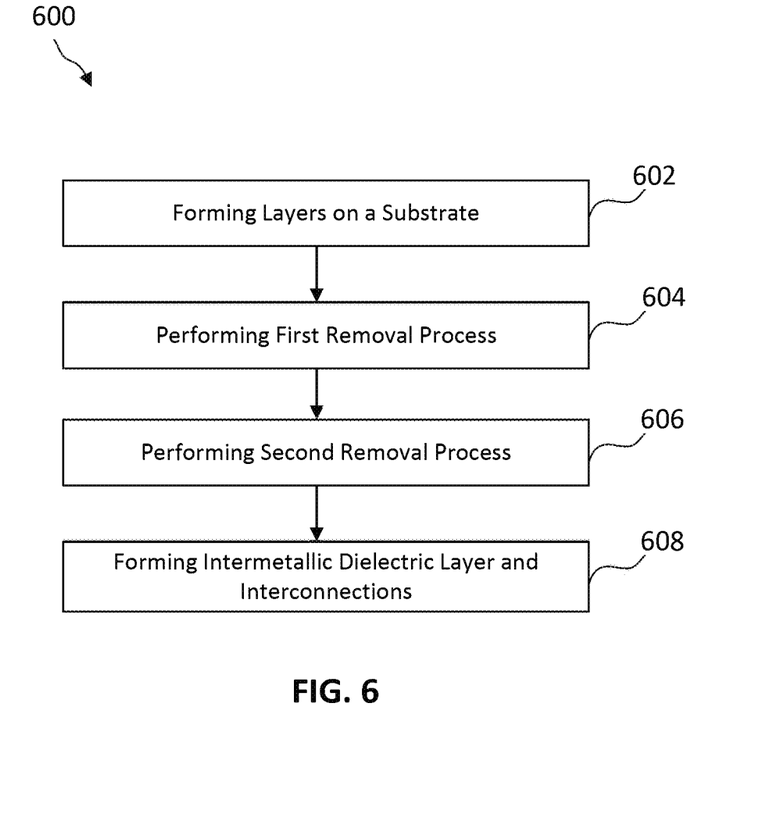
FIG. 6 is a flow diagram of an exemplary method of forming an exemplary double MIM capacitor structure, in accordance with some embodiments.

FIGS. 2-5 illustrate different fabrication stages of MIM dual capacitor structure 100 in accordance with a flow diagram provided in FIG. 6. FIG. 6 describes an exemplary method 600 of fabricating a MIM dual capacitor structure. Other operations in method 600 can be performed and operations of method 600 can be performed in a different order and/or vary. The fabrication process described herein is used to fabricate a MIM dual capacitor structure that provides increased capacitance per unit area without using additional mask layers during fabrication, according to some embodiments.

In referring to FIG. 1, MIM dual capacitor 100 includes first parallel plate capacitor 300 formed under second parallel plate capacitor 400, in which both capacitors share a common capacitor electrode plate. The two capacitors are connected in parallel to increase the total capacitance of the capacitor structure. The MIM dual capacitor structure is compatible with current layout design and process flow without the need for additional masks because second capacitor structure 400 can utilize a layout shift design that is incorporated into the same mask used for first capacitor structure 300. The total capacitance of the MIM dual capacitor structure can be adjusted at least by varying the overlap surface areas of the first and second capacitors, thereby improving capacitance range in chip designs. The fabrication processes provided herein are exemplary, and alternative processes in accordance with this disclosure may be performed that are not shown in these figures.

Figure 2:
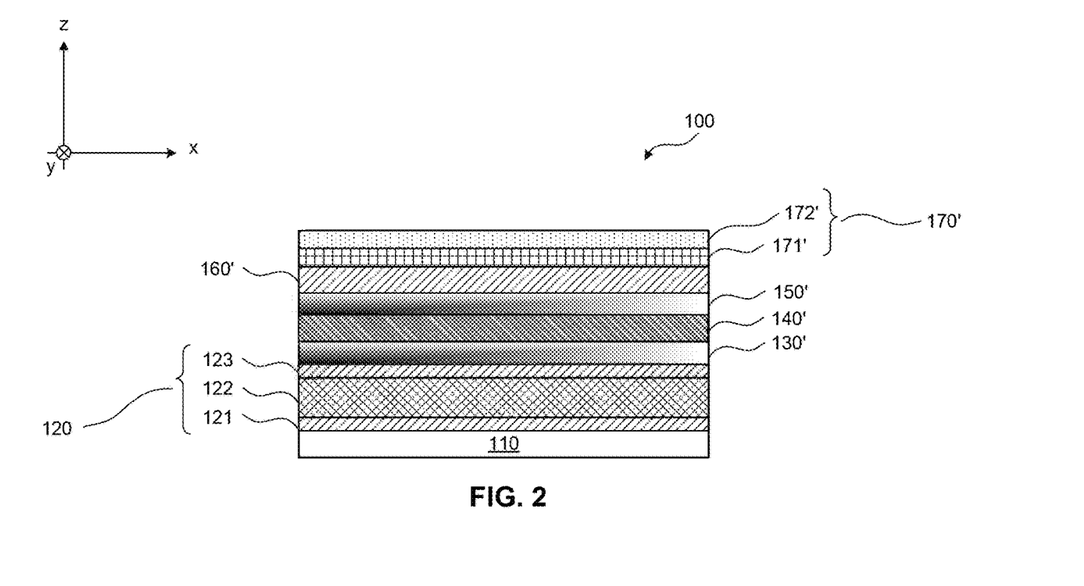
FIG. 2 is a cross-sectional view of a partially-fabricated exemplary double MIM capacitor structure, in accordance with some embodiments.

Referring to FIG. 6, method 600 begins at operation 602 by forming a number of layers on a substrate, according to some embodiments. FIG. 2 is a cross-sectional view of an exemplary partially fabricated MIM dual capacitor structure that includes a number of layers formed on substrate 110.

First capacitor electrode 120 is disposed on the substrate 110. In some embodiments, first capacitor electrode 120 includes sublayers. For example, first capacitor electrode 120 can include a first sublayer 121, a second sublayer 122, and a third sublayer 123. First sublayer 121 is formed over substrate 110 and can be made of tantalum nitride (TaN). In some embodiments, first sublayer 121 can be formed of aluminum copper alloy (AlCu), aluminum, copper, other suitable materials, and/or combinations thereof. The deposition of first sublayer 121 can be done by, for example, physical vapor deposition (PVD). In some embodiments, any suitable processes can be used to form first sublayer 121 such as, for example, atomic layer deposition (ALD), molecular beam epitaxy (MBE), high density plasma CVD (HDPCVD), metal organic (MOCVD), remote plasma CVD (RPCVD), plasma-enhanced CVD (PECVD), plating, other suitable methods, and/or combinations thereof. The deposition process can be performed in a deposition chamber, such as a PVD chamber, at a pressure below about 20 mTorr and at a temperature of about 100° C. The power level used in the deposition process can be in a range from about 1000 W to about 6000 W. In some embodiments, the thickness of first sublayer 121 can be in a range from about 100 Å to about 300 Å (e.g., 100 Å to 300 Å). For example, first sublayer 121 can be a TaN layer that has a thickness of about 200 Å.

Second sublayer 122 is formed over first sublayer 121 and can be made of AlCu. In some embodiments, second sublayer 122 can be formed using suitable materials similar to or different than first sublayer 121. For example, second sublayer 122 can be formed of TaN, aluminum, copper, other suitable materials, and/or combinations thereof. The deposition of second sublayer layer 122 can be done by a deposition process similar to the deposition process for first sublayer 121 such as, for example, a PVD process. In some embodiments, the deposition can be a different deposition process. For example, the deposition process of second sublayer 122 can be performed in a PVD chamber at a temperature of about 170° C. and a power level in a range from about 500 W to about 20000 W. In some embodiments, the thickness of second sublayer 122 can be in a range from about 1100 Å to about 1300 Å (e.g., 1100 Å to 1300 Å). For example, second sublayer 122 can be an AlCu layer that has a thickness of about 1200 Å.

Third sublayer 123 is formed over second sublayer 122 and can be made of TaN. In some embodiments, third sublayer 123 can be formed using suitable materials similar to or different than first sublayer 121. For example, third sublayer 123 can be formed of AlCu, aluminum, copper, other suitable materials, and/or combinations thereof. The deposition of third sublayer layer 123 can be done by a deposition process similar to the deposition process for first sublayer 121 such as, for example, a PVD process. In some embodiments, the deposition can be a different deposition process. For example, the deposition process of third sublayer 123 can be performed in a PVD chamber at a temperature of about 100° C. and a power level in a range from about 1000 W to about 6000 W. In some embodiments, the thickness of third sublayer 123 can be in a range from about 500 Å to about 700 Å (e.g., 500 Å to 700 Å). For example, third sublayer 123 can be a TaN layer that has a thickness of about 600 Å.

A first dielectric material 130' is formed on the top surface of first capacitor electrode 120. First dielectric material 130' can be made of a high-k dielectric material. In some embodiments, first dielectric material 130' can be formed of any suitable dielectric material such as, for example, silicon nitride ($SiN_x$). Other suitable dielectric material can be used such as, for example, silicon oxide ($SiO_x$), hafnium oxide ($HfO_2$), silicon oxynitride, other suitable dielectric material, and/or combinations thereof. First dielectric material 130' or first dielectric layer 130 has a relative dielectric constant denoted as $\epsilon_A$. In some embodiments, first dielectric material 130' can include one or more layers. First dielectric material 130' is used to form first dielectric layer 130 (of first capacitor structure 300 in FIG. 1) and its thickness can be selected based on a desired capacitance. In some embodiments, the thickness dA of first dielectric material 130' can be in a range from about 100 Å to about 500 Å (e.g., 200 Å to 500 Å or 100 Å to 400 Å). For example, first dielectric layer 130' can be an $SiO_x$ layer with a thickness in a range from about 100 Å to about 400 Å. In some embodiments, first dielectric material 130' can be an $SiN_x$ layer with a thickness in a range from about 200 Å to about 500 Å. First dielectric material 130' can be deposited using any suitable processes such as, for example, PVD, ALD, MBE, HDPCVD, MOCVD, RPCVD, PECVD, plating, other suitable methods, and/or combinations thereof.

A second electrode layer 140' is disposed over first dielectric material 130'. In some embodiments, second electrode layer 140' can be formed using the same material as first capacitor electrode 120. In some embodiments, second electrode layer 140' can be formed using a different material. For example, second electrode layer 140' can be formed using TaN. In some embodiments, second electrode layer 140' can be formed of AlCu, aluminum, copper, other suitable materials, and/or combinations thereof. The deposition of second electrode layer 140' can be done by any suitable processes such as, for example, PVD, ALD, MBE, HDPCVD, MOCVD, RPCVD, PECVD, plating, other suitable methods, and/or combinations thereof. For example, second electrode layer 140' can be a TaN layer that has a thickness of about 800 Å. In some embodiments, the thickness of second electrode layer 140' can be in a range from about 200 Å to about 2000 Å (e.g., 200 Å to 2000 Å).

A second dielectric material 150' is formed on a top surface of second electrode layer 140'. Second dielectric material 150' can be made of a high-k dielectric material. In some embodiments, second dielectric material 150' can be formed using a process or material that is similar to or different from the deposition process or material of first dielectric material 130'. Second dielectric material 150' or second dielectric layer 150 has a relative dielectric constant denoted as $\epsilon_B$. Second dielectric material 150' can be formed of any suitable dielectric material such as, for example, $SiN_x$. In some embodiments, other suitable dielectric material can be used. In some embodiments, the thickness dB of second dielectric material 150' can be in a range from about 100 Å to about 500 Å (e.g., 200 Å to 500 Å, or 100 Å to 400 Å). For example, second dielectric layer 130' can be an $SiO_x$ layer with a thickness in a range from about 100 Å to about 400 Å. In some embodiments, first dielectric layer 130' can be an $SiN_x$ layer with a thickness in a range from about 200 Å to about 500 Å. First dielectric material 130' can be deposited using any suitable processes and can be similar to the deposition process used to form first dielectric material 130'.

A third electrode layer 160' is disposed over second dielectric material 150'. In some embodiments, third electrode layer 160' can be formed using the same material as first capacitor electrode 120 or second electrode layer 140'. In some embodiments, third electrode layer 160' can be formed using a different material. For example, second electrode layer 160' can be formed using TaN. In some embodiments, second electrode layer 140' can be formed from AlCu, aluminum, copper, other suitable materials, and/or combinations thereof. The deposition of second electrode layer 141' can be done by any suitable processes similar to deposition processes used to deposit first capacitor electrode 120 and second electrode layer 140'. For example, third electrode layer 160' can be a TaN layer that has a thickness of about 800 Å. In some embodiments, the thickness of third electrode layer 160' can be in a range from about 200 Å to about 2000 Å (e.g., 200 Å to 2000 Å).

A capping material 170' is disposed over and covers a top surface of third electrode layer 160'. Capping material 170' can be used to protect the underlying layers from subsequent fabrication processes. In some embodiments, capping material 170' can be a hardmask layer. For example, capping layer 170 can be a hardmask layer formed from silicon nitride, silicon oxide, silicon oxynitride, other suitable materials, and/or combinations thereof. In some embodiments, capping material 170' is formed using a single layer. In some embodiments, capping material 170' is formed using two or more layers. For example, capping material 170' can include a first capping sublayer material 171' and a second capping sublayer material 172'. In some embodiments, first capping sublayer material 171' can be a silicon oxynitride layer that has a thickness of about 300 Å. In some embodiments, second capping sublayer material 172' can be a silicon nitride layer that has a thickness of about 500 Å. The deposition of capping material 170' can be done by any suitable processes such as, for example, PVD, ALD, MBE, HDPCVD, MOCVD, RPCVD, PECVD, plating, other suitable methods, and/or combinations thereof.

Figure 3A:
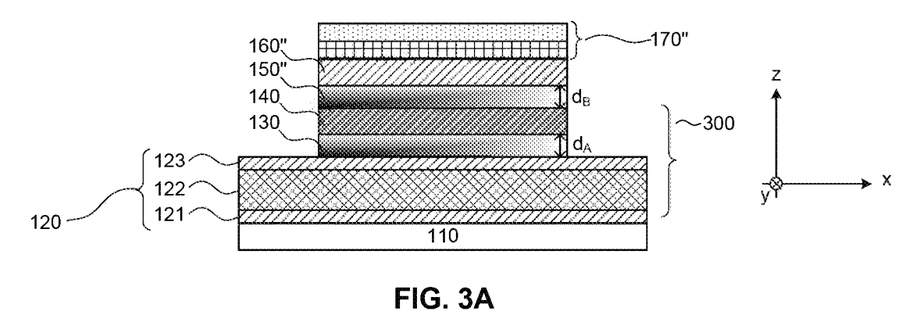
FIGS. 3A-3B are respective cross-sectional and top-down views of a partially-fabricated exemplary double MIM capacitor structure after a first removal process, in accordance with some embodiments.
Figure 3B:
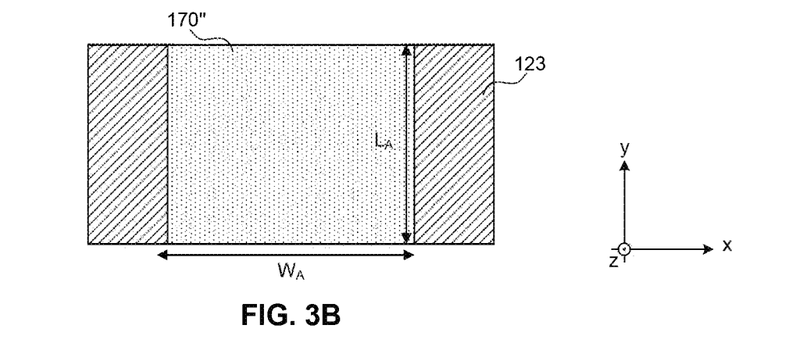

Referring to FIG. 6, method 600 continues with operation 604 by a first removal process of removing portions of first dielectric material 130', second electrode material 140', second dielectric material 150', third electrode material 160', and capping material 170', according to some embodiments. FIGS. 3A and 3B are respective cross-sectional and top-down views of an exemplary partially fabricated MIM dual capacitor structure after a first removal process that forms a first capacitor structure.

First capacitor structure 300 of MIM dual capacitor structure 100 is formed after a first removal process. The first removal process removes portions of the layers and structures described above with reference to FIG. 2 and forms first capacitor structure 300 with first capacitor electrode 120, first dielectric layer 130, and second capacitor electrode 140. For example, as shown in FIG. 3A, first removal process can include patterning and etching processes that remove portions of capping material 170', third electrode material 160', second dielectric material 150', second electrode material 140', and first dielectric material 130'.

The first removal process can begin with patterning and etching capping material 170'. A masking layer can be formed over capping material 170' and patterned to protect regions of capping material 170' during the etching process. The masking layer can be patterned such that nominal dimensions such as width and/or lengths of first capacitor structure 300 can be achieved through the patterning and etching processes of the first removal process. Dimensions such as width and length of protected regions of capping material 170' can be determined by the nominal dimensions of first dielectric layer 130 and second capacitor electrode 140. Composition of the masking layer can include a photoresist, a hard mask, and/or other suitable materials. Examples of hard mask can include silicon nitride, silicon oxide, and/or other suitable materials. The patterning process can include forming the masking layer over capping material 170', exposing the resist to a pattern, performing post-exposure bake processes, and developing the resist to form a masking element consisting of the photoresist. The masking element can then be used to protect regions of capping material 170' while one or more etching processes sequentially removes exposed underlying capping material 170', third electrode material 160', second dielectric material 150', second electrode material 140', and first dielectric material 130'. In some embodiments, the covered regions of capping material 170' can also be used as masking element during the etching process.

The etching processes can be performed using dry etching processes such as, for example, a reactive ion etch (RIE) and/or other suitable processes. In some embodiments, the etching processes can be formed using wet chemical etching process. As multiple layers of material need to be removed, one or more etching processes may be needed where each process can be selected for etching a specific type of material. For example, respective third and second electrode material 160' and 150' can be removed using the RIE process to remove metals such as, for example, AlCu, aluminum, copper. The RIE process can include one or more steps or cycles such as, for example, stabilization, main etching, over etching, etch break, other suitable processes, and/or combinations thereof. The RIE process can be performed at a pressure below about 20 mTorr. The top radio frequency (RF) power level used in the etching process can be in a range from about 400 W to about 700 W, and the bias RF power can be in a range from 0 to about 250 W. Any suitable gases for the RIE process can be used such as, for example, chlorine, boron trichloride, nitrogen, helium, argon, other suitable gases, and/or combinations thereof. In some embodiments, the removal process continues until the underlying first capacitor electrode 120 is exposed. In some embodiments, the removal process continues until a portion of first dielectric material 130' is removed and first capacitor electrode 120 is not exposed. After the first removal process, remaining portions of first dielectric material 130' forms first dielectric layer 130 and remaining portions of second electrode material 140' forms second capacitor electrode 140. Similarly, capping material 170', third electrode material 160', and second dielectric material 150' form remaining capping material 170", remaining third electrode material 160" and remaining second dielectric material 150", respectively. The masking layer can be removed after the first removal process is completed.

As shown in the top-down view in FIG. 3B, nominal dimensions such as width WA and/or length LA of first dielectric layer 130 and second capacitor electrode 140 of first capacitor structure 300 can be achieved through the first removal process. For illustration purposes, the z direction is shown in FIG. 3B as a direction pointing out of the page. The surface area AA of first dielectric layer 130 and second capacitor electrode 140 (as viewed from top-down in FIG. 3B) is calculated using $A_A = W_A * L_A$ and can be determined by device needs or placement restrictions. The capacitance $C_A$ of first capacitor structure 300 can be calculated using $C_A = \epsilon_0 * \epsilon_A * A_A / d_A$, where $\epsilon_0$ is the absolute dielectric constant of vacuum, $\epsilon_A$ is the relative dielectric constant for the first dielectric layer 130, $A_A$ is the surface area of second capacitor electrode 140, and $d_A$ is the thickness of first dielectric layer 130. Although surface area of first capacitor electrode 120 is larger than the surface area of second capacitor electrode 140, the effective area of first capacitor structure 300 that determines its capacitance value is calculated using the overlapping surface area of its first and second capacitor electrodes. As described above, the surface area $A_A$ of first capacitor structure 300 is determined by multiplying width $W_A$ and length $L_A$. In some embodiments, width $W_A$ can be between about 0.5 μm to about 200 μm. Width $W_A$ can be any suitable value such as, for example, in a range from about 2 μm to about 100 μm (e.g., 2 μm to 100 μm). In some embodiments, width $W_A$ can be smaller than 2 μm or larger than 100 μm, depending on device needs or placement restrictions. Similarly, length $L_A$ can be between about 0.5 μm to about 200 μm and be any suitable value such as, for example, in a range from about 2 μm to about 100 μm (e.g., 2 μm to 100 μm). In some embodiments, width $W_A$ or length $L_A$ can be the same as the width or length of the underlying first capacitor electrode 120. For example, as shown in FIG. 3B, length $L_A$ of first dielectric layer 130 and second capacitor electrode 140 are the same as the length of first capacitor electrode 120. In some embodiments, width $W_A$ can be smaller than 2 μm or larger than 100 μm, depending on device needs or placement restrictions. For example, first dielectric layer 130 and second capacitor electrode 140 can have a square surface area $A_A$ that is measured as 2 μm by 2 μm, 5 μm by 5 μm, 100 μm by 100 μm, 200 μm by 200 μm, or any suitable dimensions. In some embodiments, first dielectric layer 130 and second capacitor electrode 140 can be other shapes such as, for example, rectangle, circle, ellipse, or any other suitable shapes.

Referring to FIG. 6, method 600 continues with operation 606 of second removal process by removing portions of remaining second dielectric material 150", remaining third electrode material 160", and remaining capping material 170" which respectively form second dielectric layer 150, third capacitor electrode 160, and capping layer 170, according to some embodiments. Capping layer 170 can include first and second capping sublayers 171 and 172, respectively. FIGS. 4A-4D are cross-sectional and top-down views of an exemplary partially fabricated MIM dual capacitor structure after a second removal process that forms a second capacitor structure.

A second capacitor structure 400 of MIM dual capacitor structure 100 is formed after a second removal process. The second removal process removes portions of the layers and structures described above with reference to FIG. 3A and forms a second capacitor structure 400 having second capacitor electrode 140, second dielectric layer 150, and third capacitor electrode 160. The second removal process can be a removal process similar to the first removal process and can include patterning and etching processes that removes portions of remaining capping material 170", remaining third electrode material 160", and remaining second dielectric material 150". Similar to the first removal process, the removal processes used in the second removal process can be selected based on the material to be etched.

The patterning process used to define second capacitor structure 400 utilizes a layout shift design that can be incorporated into the same mask used for first capacitor structure 300. Therefore, the MIM dual capacitor structure design is compatible with current process flows without the need for additional masks. In some embodiments, the first layout pattern used in the first removal process can be modified and incorporated on the same mask to define the second capacitor structure 400. In some embodiments, during the design phase of the second layout pattern, the first layout pattern can be shifted in the x- and/or y-direction and added as a new layout pattern to the same mask. The first layout pattern can also be modified by changing its pattern dimensions and added as a new layout pattern to the same mask, according to some embodiments. In some embodiments, the second removal process can take the mask that includes the first layout pattern and shift it in the x- and/or y-direction in the lithography equipment prior to exposure, such that the patterned masking layer in the second removal process exposes at least a portion of remaining capping material 170" while protecting the other structures during the subsequent etching process. The second layout pattern is transferred to the remaining capping material 170" and other underlying layers through the etching processes. Specifically, the horizontal dimensions of second capacitor structure 400 such as its width or length is determined by the second layout pattern, which can be formed by shifting the first layout pattern in the x- and/or y-direction.

Nominal dimensions such as width and/or lengths of second capacitor structure 400 can be achieved through the patterning and etching process of the second removal process. FIGS. 4B-4F illustrate various embodiments of partially fabricated MIM dual capacitor structures with second capacitor structure formed with different second layout patterns.

In some embodiments, the patterning process used to define second capacitor structure 400 utilizes a layout shift design in the x-direction using the same mask as in the first removal process. As viewed from top-down in FIG. 4B, the widths of remaining capping material 170" and underlying layers are reduced in the x-direction while their lengths in the y-direction remain the same after the patterning and etching process. As discussed above, this can be achieved by shifting the first layout pattern used in the first removal process and incorporating the shifted layout pattern onto the same mask. For example, the first layout pattern can be shifted in the x-direction and added as a new layout pattern, in which the new layout pattern is used in the second removal process. In some embodiments, prior to the exposure process of the second removal process, the mask that includes the first layout pattern is shifted in the x-direction in the lithography equipment, such that the patterned masking layer in the second removal process exposes at least a portion of remaining capping material 170" while protecting the other structures during the subsequent etching process. The second layout pattern is then transferred to the remaining capping material 170" and other underlying layers through the etching processes. Specifically, the horizontal dimensions of second capacitor structure 400 such as its width or length is determined by the second layout pattern which can be formed by shifting the first layout pattern in the x- and/or y-direction.

The second removal process forms third capacitor electrode 160 and second dielectric layer 150 both having width WB and length LB. First and second capping sublayers 171 and 172 can share similar horizontal dimensions as third capacitor electrode 160 and second dielectric layer 150. At least one dimension of second capacitor structure 400 is less than the corresponding dimension of first capacitor structure 300. For example, width $W_B$ can be less than width $W_A$ by about 1 μm to about 200 μm (e.g., 1 μm to 200 μm). In some embodiments, width WB can be in a range from about 1 μm to about 200 μm (e.g., 1 μm to 200 μm). Similar to the first capacitor structure 300, the surface area AB of second dielectric layer 150 and third capacitor electrode 160 (as viewed from top-down in FIG. 4B) is calculated using $A_B=W_B*L_B$ and can be determined by device needs or placement restrictions. The capacitance $C_B$ of second capacitor structure 300 can be calculated using $C_B=\epsilon_0*\epsilon_B*A_B/d_B$, where $\epsilon_0$ is the absolute dielectric constant of vacuum, $\epsilon_B$ is the relative dielectric constant for the first dielectric layer 130, $A_B$ is the surface area of second capacitor electrode 140, and $d_B$ is the thickness of second dielectric layer 150.

In some embodiments, the patterning process used to define second capacitor structure 400 utilizes a layout shift design in the y-direction using the same mask as in the first removal process. As viewed from top-down in FIG. 4C, the lengths of remaining capping material 170" and underlying layers are decreased in the y-direction while their widths in the x-direction remain the same after the patterning and etching process. Similar to the processes described above with reference to FIG. 4B, this can be achieved by shifting the first layout pattern used in the first removal process and incorporating the shifted layout pattern onto the same mask. In some embodiments, length $L_B$ can be less than length $L_A$ by about 1 μm to about 200 μm (e.g., 1 μm to 200 μm). In some embodiments, length $L_B$ can be in a range from about 1 μm to about 200 μm (e.g., 1 μm to 200 μm).

In some embodiments, the patterning process used to define second capacitor structure 400 utilizes a layout shift design in both the x- and y-directions using the same mask as in the first removal process. As viewed from top-down in FIG. 4D, both the widths and lengths of remaining capping material 170" and underlying layers are decreased. Similar to the processes described above with reference to FIG. 4C, nominal dimensions for second capacitor structure 400 can be achieved by shifting the first layout pattern used in the first removal process and incorporating the shifted layout pattern onto the same mask. In some embodiments, similar to the processes described above with reference to FIG. 4B, the patterning process in the second removal processes can utilize a shifted mask in the lithography process. For example, width WB can be less than width $W_A$ by about 1 μm to about 200 μm (e.g., 1 μm to 200 μm). In some embodiments, width $W_B$ can be in a range from about 1 µm to about 200 µm (e.g., 1 µm to 200 µm). In some embodiments, length $L_B$ can be less than length $L_A$ by about 1 µm to about 200 µm (e.g., 1 µm to 200 µm). In some embodiments, length $L_B$ can be in a range from about 1 µm to about 200 µm (e.g., 1 µm to 200 µm). The masking layer can also be removed after the second removal process is completed. The removal processes can be any suitable removal processes such as, for example, a plasma etching process, a wet chemical etching process, other suitable removal processes, and/or combinations thereof.

In some embodiments, the patterning process used to define second capacitor structure 400 utilizes a layout shift design in the both the x- and y-directions using the same mask as in the first removal process. As viewed from top-down in FIG. 4E, first capping sublayer 171 and underlying layers are formed by reducing both the widths and lengths of remaining capping material 170" and underlying layers of FIGS. 3A and 3B. However, different from FIG. 4D above, the reduction may not carry through the entire distance in the respective perpendicular direction. For example, a reduction of width WB (in the x-direction) removes a portion of the material along the length $L_B$ (in the y-direction), or vice versa. Therefore, nominal dimensions for second capacitor structure 400 can be achieved by shifting the first layout pattern used in the first removal process and incorporating the shifted layout pattern onto the same mask. In some embodiments, similar to the processes described above with reference to FIG. 4B, the patterning process in the second removal processes can utilize a shifted mask in the lithography process. The patterning process to form the resulting stack structure in FIG. 4E can include forming a negative photoresist layer masking layer over capping material 170" shown in FIGS. 3A and 3B, exposing the negative photoresist to a pattern, performing post-exposure bake processes, and developing the resist to form a masking element consisting of the photoresist. The exposed portions of the negative photoresist remain on the substrate after a photoresist developing process while the unexposed portions are removed. In some embodiments, width $W_B$ can be less than width $W_A$ by about 1 µm to about 200 µm (e.g., 1 µm to 200 µm). In some embodiments, width $W_B$ can be in a range from about 1 µm to about 200 µm (e.g., 1 µm to 200 µm). In some embodiments, length $L_B$ can be less than length $L_A$ by about 1 µm to about 200 µm (e.g., 1 µm to 200 µm). In some embodiments, length $L_B$ can be in a range from about 1 µm to about 200 µm (e.g., 1 µm to 200 µm). The photoresist layer can be removed after the second removal process is completed.

After the second removal process, second dielectric layer 150 and third capacitor electrode 160 have a surface area $A_B$. The widths or lengths of second dielectric layer 150 and third capacitor electrode 160 can be any suitable dimensions to achieve a nominal capacitance. For example, the widths and lengths can be 1 µm, 2 µm, 100 µm, 200 µm, or any suitable dimensions. In the structure described above in FIG. 4B, second dielectric layer 150 and third capacitor electrode 160 have a square surface area $A_B$ measured as $A_B=W_B*L_A$. In the structure described above in FIG. 4C, square surface area $A_B$ is measured as $A_B=W_A*L_B$. In the structure described above in FIG. 4D, the square surface area $A_B$ is measured as $A_B=W_B*L_B$. In the structure described above in FIG. 4E, the square surface area $A_B$ is measured as $A_B=W_A*L_A-W_B*L_B$. In some embodiments, the processing parameters of the first and second removal processes can be adjusted such that the various conductive and dielectric layers of first and second capacitor structures can have sidewalls that have slope profiles that are not perpendicular to the horizontal substrate surface or the top surfaces of conductive and dielectric layers, as viewed in the cross-sectional view of the partially fabricated capacitor structure in FIG. 4F. For example, in a plasma etching process, one or more processing parameters such as, for example, process timing, chamber pressure, gas mixtures, processing temperatures, radio frequency (RF) power levels, and/or other suitable processing parameters, can be adjusted to achieve a nominal sidewall slope profile. As shown in FIG. 4F, the angle α between the sidewalls and the horizontal substrate surface can be in a range from about 70 degrees and 89 degrees and achieved by adjusting one or more processing parameters of the removal processes.

Referring to FIG. 6, method 600 continues with operation 608 by forming an intermetallic dielectric layer and capacitor interconnecting structures such as interconnects and contacts, according to some embodiments. FIG. 5 is a cross-sectional view of an exemplary partially fabricated MIM dual capacitor structure after a first interconnect 503, a second contact 505, a third contact 507, a second interconnect 509, an intermetallic dielectric layer 510, dielectric layer 512 are formed.

As shown in FIG. 5, intermetallic dielectric layer 510 is formed over the structures described above with reference to FIGS. 4A-4F. Intermetallic dielectric layer 510 can be formed using undoped silica glass (USG), fluorinated silica glass (FSG), a low k material, an extremely low-k dielectric, other suitable materials, and/or combinations thereof. Any suitable deposition process can be used to form intermetallic dielectric layer 510 such as, for example, PVD, ALD, MBE, HDPCVD, MOCVD, RPCVD, PECVD, plating, other suitable methods, and/or combinations thereof. Thickness of the intermetallic dielectric layer 510 can be in a range from about 500 Å to about 10000 Å. Openings are formed in intermetallic dielectric layer 510 and filled with conductive material to form electrical connections that connect first and second capacitor structures in parallel. In some embodiments, the width of the openings can be in a range from about 0.1 µm to about 0.6 µm (e.g., 0.1 µm to 0.6 µm). In some embodiments, the width of the opening can be in a range from about 0.3 µm to about 0.4 µm (e.g., 0.3 µm to 0.4 µm). In some embodiments, dielectric layer 512 can be formed using the same material as intermetallic dielectric layer 510. In some embodiments, the materials of intermetallic dielectric layer 510 and dielectric layer 512 can be different from each other.

As described above with reference to FIG. 1, interconnect structures including a first contact 501 can be used to provide an electrical connection to second capacitor electrode 140. A first interconnect 503 can be used to provide electrical connection to first contact 501 and can also be used as a metallic interconnect for electrically connecting MIM dual capacitor structure 100 to exterior devices or peripheral circuits. Second and third contacts 505 and 507 can be used to provide an electrical connection to third and first capacitor electrodes 160 and 120, respectively. A second interconnect 509 can be used to electrically connect second and third contacts 505 and 507. Second capacitor structure 400 is formed over first capacitor structure 300, and both capacitor structures share a common capacitor plate—namely, second capacitor electrode 140.

Various embodiments in accordance with this disclosure provide mechanisms of forming dual MIM capacitor structures to increase capacitance per unit area in a semiconductor structure. The two MIM parallel plate capacitor structures can be connected in parallel using the interconnect structures described above to increase the capacitance per unit area. The total capacitance of the MIM dual capacitor structure equals to the sum of capacitances CA and CB of each capacitor structure respectively. Therefore, compared to a single capacitor structure which occupies the same surface area in the semiconductor structure, the MIM dual capacitor structure provides higher capacitance per unit area due to a second capacitor structure formed over the first capacitor structure and within the same surface area of the semiconductor device. The MIM dual capacitor structure is compatible with current layout design and process flows without the need for additional masks because the layout pattern for the second capacitor structure can be incorporated into the mask used for forming the first capacitor structure. This incorporation can provide design flexibility and can be accomplished by various methods such as, for example, (i) the first layout pattern used in forming the first capacitor structure can be shifted in the x- and/or y-direction and incorporated on the same mask to define the second capacitor structure; (ii) the first layout pattern can also be modified by changing its pattern dimensions and added as a new layout pattern to the same mask; and (iii) the patterning process for forming the second capacitor structure can utilize the mask that includes the first layout pattern and shifted it in the x- and/or y-direction for use in the exposure process.

In some embodiments, a semiconductor structure includes a substrate and a first metal layer formed over the substrate. A first dielectric layer is formed over the first metal layer and a second metal layer is formed over the first dielectric layer. A surface area of the second metal layer is less than a surface area of the first metal layer. Further, a second dielectric layer is formed over the second metal layer while a third metal layer is formed over the second dielectric layer. A surface area of the third metal layer is less than the surface area of the second metal layer. The semiconductor structure further includes one or more interconnect structures that are electrically connected to the first and third metal layers.

In some embodiments, a semiconductor structure includes a first capacitor structure formed over a substrate. The first capacitor structure includes a first capacitor electrode, a first dielectric layer, and a second capacitor electrode. The semiconductor structure also includes a second capacitor structure which includes the second capacitor electrode, a second dielectric layer, and a third capacitor electrode. An intermetallic dielectric layer is formed over the first and second capacitor structures. A first contact is formed in the intermetallic dielectric layer and electrically coupled to the first capacitor electrode. A second contact is also formed in the intermetallic dielectric layer and electrically coupled to the second capacitor electrode. The semiconductor structure also includes a third contact formed in the intermetallic dielectric layer and electrically coupled to the third capacitor electrode. The first and third contacts are electrically coupled to each other.

In some embodiments, a method of fabricating a semiconductor structure includes depositing a first metal layer over a substrate and depositing a first dielectric layer over the first metal layer. A second metal layer is deposited over the first dielectric layer and the second metal layer has a surface area that is less than a surface area of the first metal layer. A second dielectric layer is deposited over the second metal layer and a third metal layer is deposited over the second dielectric layer. The third metal layer has a surface area that is less than the surface area of the second metal layer. The method further includes electrically connecting the first and third metal layers by one or more interconnect structures.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A method, comprising:
    forming a capacitor stack, comprising depositing a first electrode, a first dielectric layer, a second electrode, a second dielectric layer, and a third electrode on a substrate;
    forming a first pattern of the capacitor stack according to a mask, wherein the first pattern exposes the first electrode;
    shifting the mask in a direction parallel to the substrate;
    forming, after shifting the mask, a second pattern of the capacitor stack according to the mask, wherein the second pattern exposes the second electrode; and
    forming an interconnect structure electrically connecting the first and third electrodes.

2. The method of claim 1, wherein forming the first pattern comprises etching a portion of the capacitor stack uncovered by the mask to expose the first electrode.

3. The method of claim 1, wherein forming the second pattern comprises etching a portion of the capacitor stack uncovered by the mask to expose the second electrode.

4. The method of claim 1, wherein the first pattern comprises a rectangular pattern.

5. The method of claim 1, wherein the second pattern is shifted from the first pattern by about 2 µm to about 100 µm.

6. The method of claim 1, further comprising depositing an intermetallic dielectric layer over the capacitor stack.

7. The method of claim 1, further comprising forming a metal contact electrically connected to the second electrode.

8. The method of claim 1, wherein forming the interconnect structure comprises:
    forming a first contact in contact with the first electrode;
    forming a second contact in contact with the third electrode; and
    forming an interconnect electrically connecting the first and second contacts.

9. A method, comprising:
    forming a dual capacitor stack, comprising depositing a first electrode layer, a first dielectric layer, a second electrode layer, a second dielectric layer, and a third electrode layer on a substrate;
    disposing a mask on the dual capacitor stack;
    removing a first portion of the dual capacitor stack uncovered by the mask to expose the first electrode;

physically shifting the mask in a direction parallel to the substrate to uncover a second portion of the dual capacitor stack;

removing, after shifting the mask, the second portion of the dual capacitor stack to expose the second dielectric layer;

forming a metal contact through the second dielectric layer and in contact with the second electrode layer; and forming an interconnect structure electrically connecting the first and third electrode layers.

10. The method of claim 9, wherein disposing the mask comprises disposing a rectangular patterned mask to cover the second portion of the dual capacitor stack when removing the first portion of the dual capacitor stack.

11. The method of claim 9, wherein shifting the mask in the direction parallel to the substrate comprises shifting the mask by a distance of about 2 µm to about 100 µm.

12. The method of claim 9, further comprising depositing an intermetallic dielectric layer over the dual capacitor stack.

13. The method of claim 12, wherein forming the metal contact comprises:

forming a via opening through the second dielectric layer and the intermetallic dielectric layer;

etching a portion of the second electrode layer through the via opening; and depositing a conductive material in the via opening.

14. The method of claim 12, wherein forming the interconnect structure comprises:

forming a first contact through the intermetallic dielectric layer and into the first electrode layer;

forming a second contact through the intermetallic dielectric layer and into the third electrode layer; and forming an interconnect on the intermetallic dielectric layer and electrically connecting the first and second contacts.

15. A method, comprising:

depositing a first electrode layer, a first dielectric layer, a second electrode layer, a second dielectric layer, and a third electrode layer on a substrate;

forming a first capacitor structure according to a layout pattern of a mask disposed above the third electrode layer, wherein the first capacitor structure comprises the first electrode layer, the first dielectric layer, and the second electrode layer;

shifting the mask physically in a direction parallel to the substrate;

forming, after shifting the mask, a second capacitor structure on the first capacitor structure according to the layout pattern, wherein the second capacitor structure comprises the second electrode layer, the second dielectric layer, and the third electrode layer;

forming a metal contact in contact with the second electrode layer; and connecting the first and third electrode layers.

16. The method of claim 15, wherein forming the first capacitor structure comprises:

etching a portion of the third electrode layer;
etching a portion of the second dielectric layer;
etching a portion of the second electrode layer; and
etching a portion of the first dielectric layer.

17. The method of claim 15, wherein forming the second capacitor structure comprises etching a portion of the third electrode layer.

18. The method of claim 15, wherein the layout pattern comprises a rectangular pattern.

19. The method of claim 15, wherein shifting the mask in the direction parallel to the substrate comprises shifting the mask along an edge of the layout pattern.

20. The method of claim 15, further comprising depositing an intermetallic dielectric layer over the first and second capacitor structures.

* * * * *